(12) United States Patent
Harris et al.

(10) Patent No.: US 11,255,984 B2
(45) Date of Patent: Feb. 22, 2022

(54) PHOTON INTERACTION CHARACTERISTICS FROM A SUBSET OF PIXELS

(71) Applicant: KROMEK GROUP, PLC, Sedgefield (GB)

(72) Inventors: Brian William Harris, Gibsonia, PA (US); Hidefumi Tomita, Pittsburgh, PA (US)

(73) Assignee: KROMEK GROUP, PLC, Sedgefield (GB)

( * ) Notice: Subject to any disclaimer, the term of this patent is extended or adjusted under 35 U.S.C. 154(b) by 0 days.

(21) Appl. No.: 16/868,948

(22) Filed: May 7, 2020

(65) Prior Publication Data
US 2021/0349223 A1    Nov. 11, 2021

(51) Int. Cl.
*G01T 1/24* (2006.01)
*H01L 31/0296* (2006.01)

(52) U.S. Cl.
CPC ........ *G01T 1/247* (2013.01); *H01L 31/02966* (2013.01)

(58) Field of Classification Search
CPC ........................... G01T 1/247; H01L 31/02966
See application file for complete search history.

(56) References Cited

U.S. PATENT DOCUMENTS

| | | | |
|---|---|---|---|
| 10,254,163 B1* | 4/2019 | Cherlin | H04N 5/378 |
| 2021/0022695 A1* | 1/2021 | Iniewski | A61B 6/025 |
| 2021/0063589 A1* | 3/2021 | Iniewski | G01T 1/249 |

OTHER PUBLICATIONS

Jae Cheon Kim et al., "Charge sharing in common-grid pixelated CdZnTe detectors", Nuclear Instruments and Methods in Physics Research, 2011, 11 pages, Elsevier.
Stephen E. Anderson et al., "Sub-Pixel Position Resolution in Pixelated Semiconductor Detectors", IEEE Nuclear Science Symposium Conference Record, 2007, 8 pages, IEEE Digital Library.

* cited by examiner

*Primary Examiner* — Christine S. Kim
(74) *Attorney, Agent, or Firm* — Ference & Associates LLC

(57) ABSTRACT

One embodiment provides a method, including: receiving a photon interaction occurring within a photon detector pixel array, wherein the photon detector pixel array comprises a plurality of pixels; determining a photoelectron cloud generated from the photon interaction, wherein the photon detector pixel array comprises an electric field, wherein an electrostatic repulsive force disperses a photon to the photoelectron cloud; identifying a subset of the plurality of pixels associated with the photon interaction, wherein each of the subset of the plurality of pixels corresponds to pixels activated by the photo electron cloud, wherein the subset of the plurality of pixels comprise a central pixel and a plurality of neighboring pixels, wherein the central pixel comprises the pixel having the highest amplitude response to the photon interaction; and determining, from the photoelectron cloud, a characteristic of the photon interaction, wherein the characteristic comprises at least one of: time, position, and energy of the interaction. Other aspects are described and claimed.

20 Claims, 7 Drawing Sheets

PHOTON INTERACTION CHARACTERISTICS FROM A SUBSET OF PIXELS

FIELD

This application relates generally to imaging, and, more particularly, to determining a characteristic of a photon interaction at a sub-pixelation resolution.

BACKGROUND

Imaging devices perform many different functions such as medical imaging, security screening, image capture, or the like. The source of the imaging may be a radiological source, visible light, non-visible light, or any type of source for which the imaging device is capable of detection. For example, in a medical setting, a patient may be injected with a radiopharmaceutical tracer agent and the imaging device may capture the emission of gamma photon radiation from the patient's body for diagnostic analysis. The imaging device may include a gamma camera sensitive to the emission source, for example, a camera including a specific substance or object that is sensitive to or reacts to the emission source. The camera may contain individual pixels which may allow the image to determine the location, energy, timing, and intensity of the emitted signal.

BRIEF SUMMARY

In summary, one aspect provides a method, comprising: receiving a photon interaction occurring within a photon detector pixel array, wherein the photon detector pixel array comprises a plurality of pixels; determining a photoelectron cloud generated from the photon interaction, wherein the photon detector pixel array comprises an electric field, wherein an electrostatic repulsive force disperses a photon to the photoelectron cloud; identifying a subset of the plurality of pixels associated with the photon interaction, wherein each of the subset of the plurality of pixels corresponds to pixels activated by the photo electron cloud, wherein the subset of the plurality of pixels comprise a central pixel and a plurality of neighboring pixels, wherein the central pixel comprises the pixel having the highest amplitude response to the photon interaction; and determining, from the photoelectron cloud, a characteristic of the photon interaction, wherein the characteristic comprises at least one of: time, position, and energy of the interaction.

Another aspect provides a device, comprising: a photon detector pixel array comprising a plurality of pixels; a processor operatively coupled to the photon detector pixel array; a memory device that stores instructions executable by the processor to: receive a photon interaction occurring within a photon detector pixel array, wherein the photon detector pixel array comprises a plurality of pixels; determine a photoelectron cloud generated from the photon interaction, wherein the photon detector pixel array comprises an electric field, wherein an electrostatic repulsive force disperses a photon to the photoelectron cloud; identify a subset of the plurality of pixels associated with the photon interaction, wherein each of the subset of the plurality of pixels corresponds to pixels activated by the photo electron cloud, wherein the subset of the plurality of pixels comprise a central pixel and a plurality of neighboring pixels, wherein the central pixel comprises the pixel having the highest amplitude response to the photon interaction; and determine, from the photoelectron cloud, a characteristic of the photon interaction, wherein the characteristic comprises at least one of: time, position, and energy of the interaction.

A further aspect provides a product, comprising: a storage device that stores code, the code being executable by a processor and comprising: code that receives a photon interaction occurring within a photon detector pixel array, wherein the photon detector pixel array comprises a plurality of pixels; code that determines a photoelectron cloud generated from the photon interaction, wherein the photon detector pixel array comprises an electric field, wherein an electrostatic repulsive force disperses a photon to the photoelectron cloud; code that identifies a subset of the plurality of pixels associated with the photon interaction, wherein each of the subset of the plurality of pixels corresponds to pixels activated by the photo electron cloud, wherein the subset of the plurality of pixels comprise a central pixel and a plurality of neighboring pixels, wherein the central pixel comprises the pixel having the highest amplitude response to the photon interaction; and code that determines, from the photoelectron cloud, a characteristic of the photon interaction, wherein the characteristic comprises at least one of: time, position, and energy of the interaction.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the invention will be pointed out in the appended claims.

DETAILED DESCRIPTION

Figure 1:
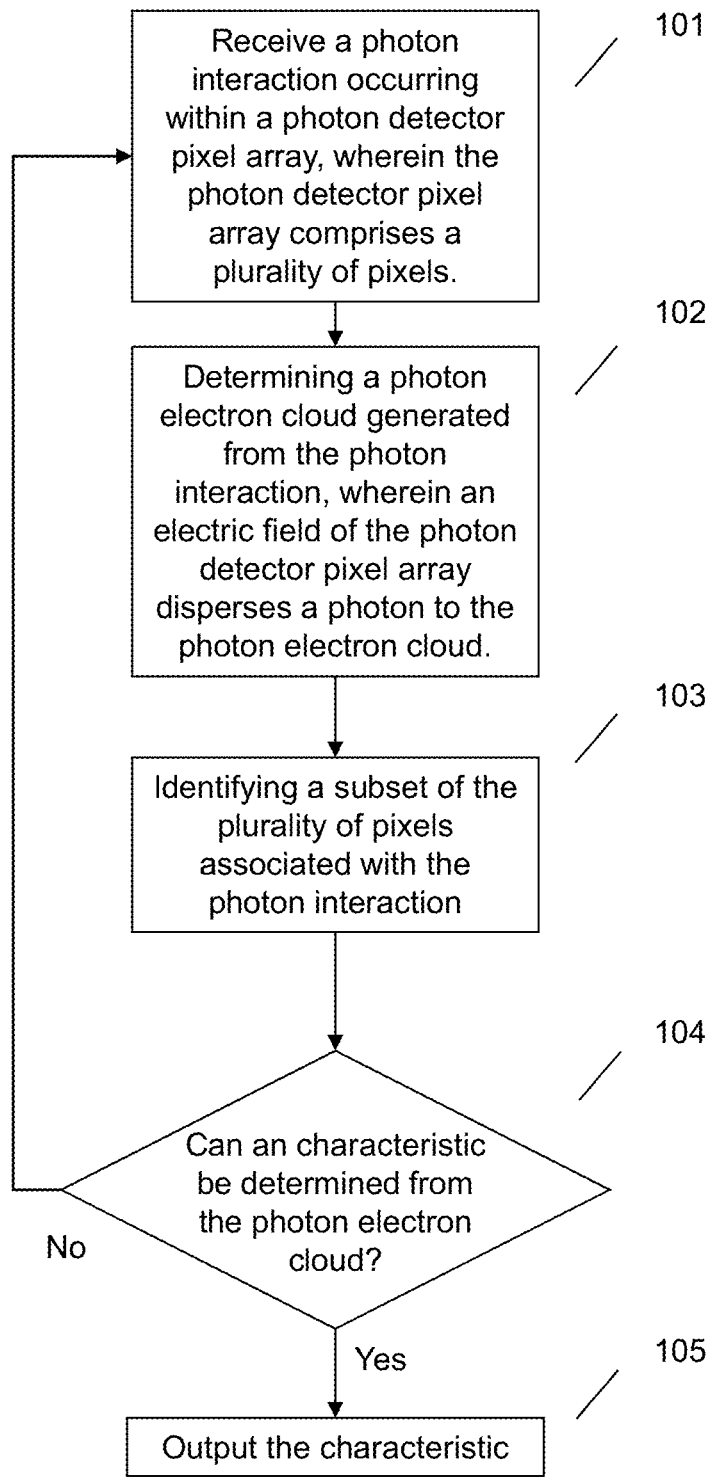
FIG. 1 illustrates a flow diagram of an example embodiment.

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

Users of imaging devices often desire image output of a high spatial, temporal, and energy resolution. For example, a medical image having high spatial, temporal, and energy resolution may influence a patient's care by directing a physician to a location of interest within the patient's body. Many imaging devices utilize a camera sensitive to the type of emission being imaged in order to accurately capture an image. To capture the image, the camera image is divided into discrete areas or picture elements (pixels), where each pixel may represent both a location and an intensity within the image captured.

By way of illustration, in a nuclear medicine (molecular imaging) setting, a patient may be injected with a radiopharmaceutical tracer agent and the imaging device (gamma camera) may capture the emission of gamma photon radiation from the patient's body for diagnostic analysis. The detectors in a gamma camera may comprise semiconductor direct-conversion materials such as CdZnTe, CdTe, HgI, and Si. A gamma photon detector pixel array comprising a semiconductor direct-conversion detector material has advantages over scintillator photon detector gamma cameras, including superior energy and spatial resolution. However, a disadvantage of such pixelated semiconductor detector arrays is a distortion of the energy spectrum of individual pixels in which some of the counts are recorded with a lower energy than the photopeak because of hole carrier trapping or charge sharing with neighbor pixels. Since image formation typically may require accepting counts only within a range of energies closely surrounding the photopeak, the counts in the lower energy spectral tail are not included in the image. This means that the gamma camera may be apparently less efficient than a scintillator camera, even if the thickness of each camera provides the same stopping power for gamma photons. This invention provides a novel solution to the charge sharing and hole trapping spectral tail problem.

The principals which led us to this invention depend upon a deep proprietary understanding of photon interactions in CdZnTe detectors and signal formation in pixelated CdZnTe detectors. However, the invention can be understood at a high level. When a gamma photon is incident upon a pixelated CdZnTe detector, preferably from the cathode side, the photon may Compton scatter zero or multiple times before depositing its remaining energy in a photoelectric interaction. These interactions may occur within a single pixel or within multiple pixels. The interactions are directly converted into a charge cloud of electrons and holes. The detector is under an electric field, typically about 100 volts per mm, with the pixelated anodes at ground potential and the typically monolithic cathode at high negative voltage. Thus, the holes are accelerated toward the cathode and the electrons toward the pixelated anodes. Since the hole mobility is typically much less than the electron mobility, it takes longer to sweep out the holes than the electrons and there is a greater possibility of trapping the holes in crystal defects. When the pixels are smaller than the thickness of the detector, then the device is much more sensitive to electrons than holes, due to the "small pixel effect."

As the electron cloud approaches the anodes, an induced voltage is detected on multiple anodes and/or pixels. When the charge cloud reaches the anode plane, the charge is collected on one or several pixels. Any neighboring pixel that detected an induced voltage will then detect an opposite polarity voltage, such that the integral over time for any non-charge collecting pixel will be zero. Thus, there are several ways in which signals may be shared between a plurality of pixels: the charge may be shared when the electron charge cloud overlaps several pixels, the photon interactions may have occurred in several pixels, due to Compton scattering or k-escape x-rays, and transient induced voltages may be detected on a plurality of neighboring pixels. Of course, hole charges are collected on the cathode and that information could be used to estimate the depth of interaction for the incident photon. This invention, however, explicitly does not use any cathode signal to determine the characteristics of the photon interaction. Furthermore, this invention uses only the positive and negative peak amplitudes of anode pixel signals. This is a tremendous simplification that makes determination of interaction characteristics a relatively simple matter of combining information from peak signal amplitudes of a plurality of anode pixels.

As with any device, there exists the problem of determining the location and energy of a signal upon a detector. A photon or particle may enter the receiving imaging unit such that the interaction of the incident photon or particle with the material of the imaging unit causes a signal to be produced at multiple pixels or detection areas. This problem may occur in the example of a photon that enters an imaging unit at an angled trajectory. A photon entering a detection unit may strike one or more pixels. In other words, a photon may enter the detector at an angle and pass through a pixel detection region or multiple pixel regions before the termination of the photon trajectory.

Current systems may have difficulty in attributing detected charges to the correct interaction upon a pixel or a subset of pixels, thereby resulting in images that have lower accuracy. Currently, many imaging devices rely on a signal or a plurality of signals from individual pixels to identify locations of interactions. Imaging techniques may take a signal from individual pixels from the imaging device's detection unit. In this manner, the imaging unit may receive a "pixelated" image of a received signal. Therefore, one central pixel may have a high value and neighboring pixels may have a lower value. However, data of how the neighboring pixel values correlate to a central pixel value may be lost in the imaging technique. For example, when a photon enters an imaging detection unit the photon may interact with multiple pixels, thereby creating signals from all the pixels that were interacted with. For example, the pixel having the main interaction may provide a signal indicating that pixel received the greatest energy from the photon and neighboring pixels may have a lesser energy value. However, it may be difficult to determine exactly where in the pixel area the photon struck. The loss of data of neighboring pixels or even resolution within a pixel itself diminishes the resolution of the imaging unit. Lower resolution of an imaging unit may lead to decreased efficiency in medical care. For example, patients may require further imaging, diagnoses may be missed, imaging sessions may be longer, costs may rise, or the like.

Accordingly, an embodiment provides a system and method for determining a photon interaction with a pixelated array at a sub-pixelation level. In an embodiment, a photon interaction may be received within a photon detector pixel array. The photon pixel array may comprise a plurality of pixels. A photoelectron cloud may be generated. The photoelectron cloud may drift across the detector, or CdZnTe (CZT) crystal, using an electric field (E-field). The photoelectron cloud may drift towards an electronics sensor within the E-field. Along the drift path, electrostatic repulsive forces may cause the diffusion of photoelectrons. The electrostatic repulses forces may be due to photoelectron being the same charge as other photoelectrons. The diffusion may be mainly perpendicular to a direction of motion of the photoelectron cloud. This diffusion may cause the spread of the photoelectron cloud before reaching an electronic sensor region. The E-field may be between an anode and a cathode. The photoelectron cloud may be determined by a photon detector pixel array. In an embodiment, the method or system may identify a subset of the plurality of pixels associated with the photon interaction. Each of the subset of the plurality of pixels may correspond to pixels activated by the photoelectron cloud. In an embodiment, a subset of the plurality of pixel may comprise a central pixel and a plurality of neighboring pixels. In an embodiment, the central pixel may be the pixel with the highest amplitude response to the photon interaction. In an embodiment, the method or system may be determined a characteristic of the photon interaction from the photoelectron cloud. The characteristic may include time, position, energy, or the like of the interaction.

Such systems and methods provide a technical improvement to current imaging techniques. Rather than requiring signals from both the cathode and anode of the detector, the embodiments as described herein capture information from both a central anode pixel and neighboring anode pixels. Using these values, the system can identify a sub-pixel resolution, thereby providing a system and method for providing images with higher resolution by being able to more accurately identify characteristics regarding the interaction, without needing cathode signals which may be difficult to obtain. The system may use a signal from neighboring anodes, which may account for charge shared between central pixel and neighbors. Typically, those shared events may not be counted. It may be possible to recombine that information and correct characteristics regarding an interaction. By correcting characteristics regarding an interaction, it is possible to improve energy resolution. These improvements may be important for medical imaging, lower patient dosing of imaging reagents, reduce exam/procedure time, or the like.

The illustrated example embodiments will be best understood by reference to the figures. The following description is intended only by way of example, and simply illustrates certain example embodiments.

The pixelated detectors, gamma cameras, and/or pixelated arrays of the various embodiments may be provided as part of different types of imaging systems, for example, nuclear medicine (NM) imaging systems such as positron emission tomography (PET) imaging systems, single-photon emission computed tomography (SPECT) imaging systems and/or x-ray imaging systems and x-ray computed tomography (CT) imaging systems, among others. The system may be affixed to an integrated gantry that further includes a rotor oriented about a gantry central bore. The rotor is configured to support one or more pixelated cameras, such as, but not limited to gamma cameras, SPECT detectors, multi-layer pixelated cameras (e.g., Compton camera) and/or PET detectors. It should be noted that when the medical imaging system includes a CT camera or an x-ray camera, the medical imaging system also includes an x-ray tube for emitting x-ray radiation towards the detectors. In various embodiments, the cameras are formed from pixelated detectors as described in more detail herein. The rotors are further configured to rotate axially about an examination axis. The operation and control of the imaging system may be performed in any manner known in the art. It should be noted that the various embodiments may be implemented in connection with imaging systems that include rotating gantries or stationary gantries.

In an embodiment, the imaging device may be installed in a location for security scanning. For example, the device may be in an airport security checkpoint, a baggage screening location, or the like. The device may comprise a plurality of x-ray sources and a plurality of pixelated photon detector arrays. In an embodiment, the imaging device may be permanently anchored, moveable, or completely portable. For example, an imaging device may be a hand-held device for use by first responders, security, or assessment teams. Other uses outside of a security setting are contemplated and are disclosed. As should be understood by one skilled in the art, both healthcare imaging and security screening are merely examples. Other possible applications for the techniques as described herein are possible and contemplated.

In an embodiment, the receiving equipment may contain sensors that are sensitive to radiological particles or photons. The receiving equipment may record communication events, also referred to as interactions, on an array of sensors located in the receiving equipment. Each of the sensors in the array may be represented as a pixel in the final image. During the course of imaging, a photon or particle may strike one or more pixel detection units. In an embodiment, the signals received from the one or more pixel detection units may be used to determine characteristics of a photon interaction. In a healthcare setting this may allow healthcare professionals to achieve better imaging in less time and with less radio-labeling delivered to a patient which may result in better treatment plans and decrease medical costs, for example, better resolution may be achieved and imaging sessions' durations may be reduced.

An embodiment of an imaging device may be in a healthcare setting, security screening, manufacturing, or any application where an imaging device may be utilized. For example, the imaging device may be a radiological imaging device in which radiological matter (consisting of particles or photons) is either transmitted through or injected into and emitted from a patient's body. Another example may include an airport or port of entry device used to scan for radiation or other material of interest for security purposes. Another example of an imaging device may be used by first responder to determine environmental conditions and/or safety of a location. Other uses are contemplated and disclosed.

Referring to FIG. 1 at 101, an embodiment may receive or capture a photon interaction or an interaction occurring within a photon detector pixel array. A photon may enter the device from a cathode side of the unit travelling toward a cathode (See FIG. 2). Receiving or capturing an interaction may include receiving one or more signals from one or more pixel detection units that indicate an interaction has occurred with the one or more pixel detection units. For readability, the discussion herein will refer to a photon as that object which is causing the interaction and resulting in the signals. However, it should be understood that the object may include a photon, light of any spectrum, a radiological particle, or any type of energy which the detection unit is capable of detecting. A photon detector pixel array may be one or more pixel detector units. A photon detector pixel array may be organized in any configuration such as a grid, a brick pattern, an interspersed pattern, or the like. The photon detector pixel array may be oriented in a flat plane, curved plane, or the like. In other words, the photon detector pixel array may be arranged in a manner that is suitable for detecting interactions from an emission source, and may be different for different applications. For example, a photon from an emission source may interact with one or more pixels on a photon pixel array as part of an imaging unit in a medical setting.

At 102, in an embodiment, the system or method may determine a photoelectron cloud generated from a photon interaction. In an embodiment, the device may have a cathode and an anode (See FIG. 2 for an example device configuration). A photon or photon interaction may enter the device at the cathode end. In an embodiment, the cathode or anode may be a single plane across the device or module. The plane may be flat or be of a curvature suited for an imaging application. The cathode may be held at a negative high voltage and/or be AC-coupled. The anode may have pixelated detection elements, be electrically grounded, and/or be DC-coupled. In an embodiment, a CdZnTe (CZT) crystal or other type of semiconductor material is between the cathode and the anode. For ease of readability, a CZT crystal will be referred to herein, but the described system is not so limited as any type of semiconductor material or imaging material may be utilized and may be based upon the application of the imaging device.

In an embodiment, a photon interaction with the CZT, or other semiconductor material, may produce or generate an electron cloud and a holes cloud. A cloud of electrons may increase in size due to electrostatic repulsion as the cloud drifts toward an anode channel. The initial creation of photo-electrons cloud may be represented by the number of $e\gamma \approx E\gamma/4.64$ eV. In an embodiment, a cloud of electrons may drift through the CZT crystal against an electric field (E-field) in a direction towards the anode and the pixel detection array. The cloud of electrons may create a negative-charge signal to one or more pixels and/or associated ASIC channel. The one or more pixels may be connected to a charge-sensitive preamplifier and/or shaping amplifier. A pixel and associated electronics may be triggered for data collection when a charge is detected.

In an embodiment with a semiconductor detector material, a photon detector pixel array may have two sides with metallic electrodes deposited on the semiconductor detector crystal. A first side may comprise a plurality of pixels, also referred to as the pixelated side, which may be arranged in a grid pattern. This side may be coupled to read-out electronics that can capture the signal from the pixelated side. In the case of CdZnTe or CdTe, in which the electron mobility is much larger than hole mobility, the pixelated side may be the anode side of the array and provide anode signals. In some configurations, this side may be connected to ground potential. In an embodiment, a second side of the detector pixel array may be substantially opposite the first side, for example, in the case of a thick sheet-like detector, the first side may be the bottom side, and the second side may be the top side, typically the side from which gamma photons may be incident upon the detector. This second side of the detector pixel array may be a cathode and may be connected to a negative voltage bias.

Figure 2:
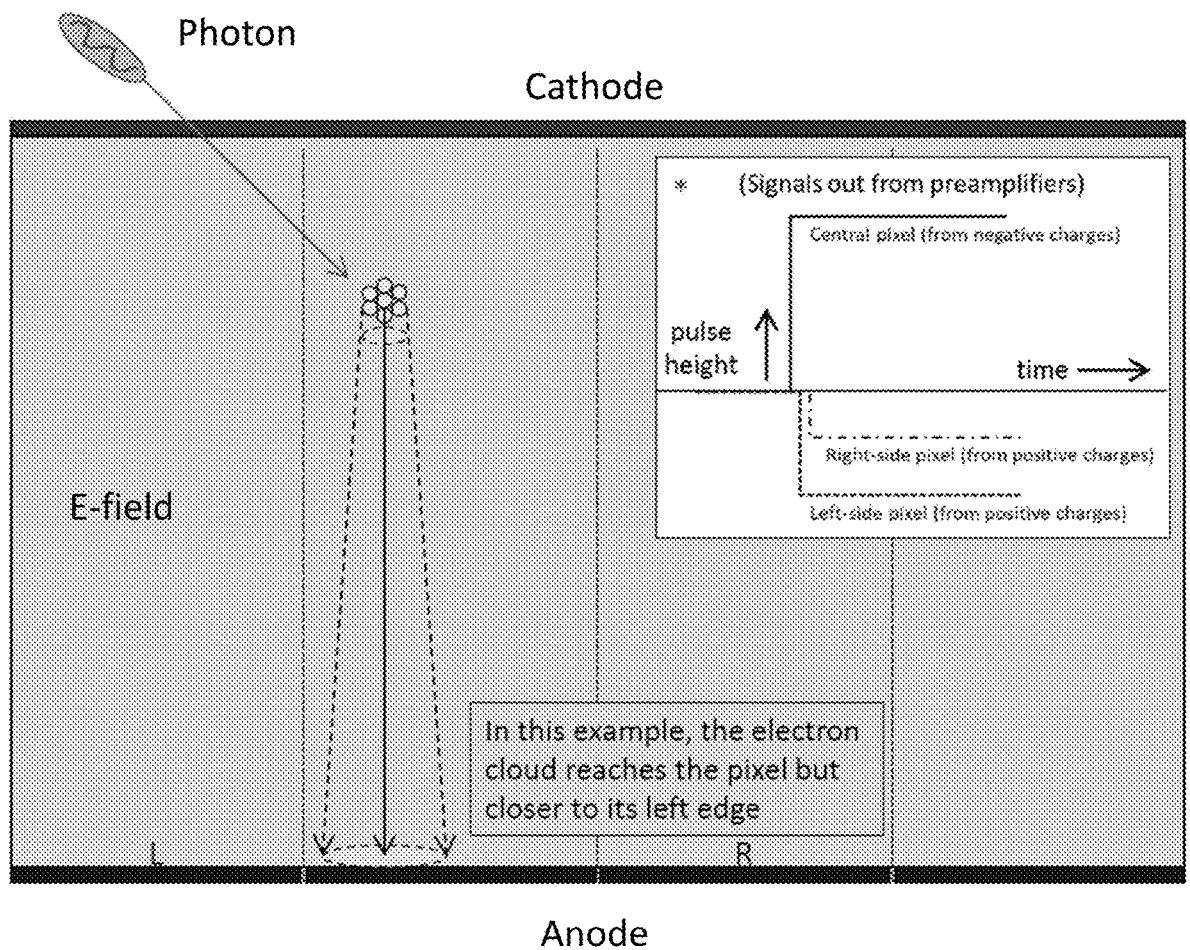
FIG. 2 illustrates an example embodiment of production of an electron cloud.

In an embodiment, a central pixel, as defined as the pixel receiving the greatest count, may receive a negative-charge induction signal. In contrast, the neighboring pixels surrounding the central pixel may receive a positive-charge induction signal. The example of FIG. 2 illustrates an electron cloud affecting a central pixel more to the left side. As an example, the FIG. 2 inset demonstrates example charge induction as measured by the central pixel and the two neighboring pixels. The central pixel receives the greatest pulse height or count as shown by the solid trace, and a negative-charge induction. The two neighboring pixels both received a positive-charge induction. For example, the left pixel has both a higher amplitude and a shorter latency as compared to the right pixel. Such data may indicate the charge cloud was received by the central pixel at a location closer to the left side as compared to the right. This is example data, and be more complex as discussed herein. For example, a central pixel may have eight neighboring pixels surrounding the central pixel to further pinpoint a location of induced charge.

At 103, in an embodiment, the method or system may identify a subset of the plurality of pixels associated with the photon interaction. In an embodiment, a pixel (See FIG. 3) refers to a discrete location on the imaging hardware surface that may be only a subset of the imaged area. A subset of pixels may correspond to pixels activated by the photoelectron cloud. The subset of pixels may comprise a central pixel and a plurality of neighboring pixels. The central pixel may be defined as the pixel with the highest amplitude response or count to the photon interaction. The data or communication from a pixel or plurality of pixels may be used to form an image as a composite from the one or more pixels.

In an embodiment, the system and method may identify a plurality of pixels associated with an interaction of a photon. For example, when a photon interacts with the detector, one or more pixels produce a signal corresponding to that interaction. As an example, as the photon moves through the pixel array, the photon interacts with different pixels. Each of these pixels then generates a signal indicating some form of interaction or contact. In an embodiment, a central pixel may be identified. This central pixel may be associated with the place of "rest" of the photon, for example, the location of a photoelectric interaction. In other words, the photon has stopped moving through the pixel array. Identification of the central pixel may be performed using one or more characteristics. For example, a central pixel may be identified as the pixel with the highest energy detected from a photon event. However, it may be possible that the central pixel does not represent the pixel having the highest energy detected by a photon interaction. As an example, if two pixels share the same level of interaction, they may provide the same highest energy value. In this case, a pixel may simply be characterized as a central pixel.

In addition to the central pixel, the system may identify one or more neighboring pixels. In an embodiment, one or more identified neighboring pixels may be in any physical location with respect to the central pixel. In other words, the neighboring pixels do not have to be direct neighbors of or directly adjacent to the central pixel. Rather, one or more neighboring pixels may be identified as pixels that receive energy from a photon that is less than the energy received by the central pixel. In other words, as the photon moves through the pixel array it may interact, for example by Compton scattering, with pixels other than the central pixel. These pixels may be identified as neighboring pixels. The one or more neighboring pixels may be in any type of configuration with respect to the central pixel. For example, the neighboring pixels may be in a "ring" or "box" configuration around the central pixel. As another example, one or more neighboring pixels may be located to one or more sides of the central pixel. As a final example, a neighboring pixel may be a single pixel adjacent to the central pixel. Each of the neighboring pixels may have different signals with respect to each other and/or the central pixel. In other words, each of the signals from the neighboring pixels may be the same, different, or a combination thereof, with respect to other neighboring pixels and/or the central pixel.

An imaging device may use many methods to detect a communication event from a pixel. For example, in a consumer camera, a pixel represents the intensity and wavelength of the visible light detected by the pixel. As another example, radiological imaging devices used in cancer screenings, radiation detectors, and the like, use a type of atomic particle or photon emitted by a source and measurable by a sensor with associated circuitry to provide both a location and intensity (or count density) of the radiological particles or photons detected. Using the communication events from the pixels, an image may be created based upon the location, intensity, and energy or wavelength of the communication event from the pixel. In other words, an embodiment may use the signal transmitted from the pixel during imaging to create an image based upon the information contained within the signal. The data may be collected from multiple pixels to create an image of a larger area.

Figure 3:
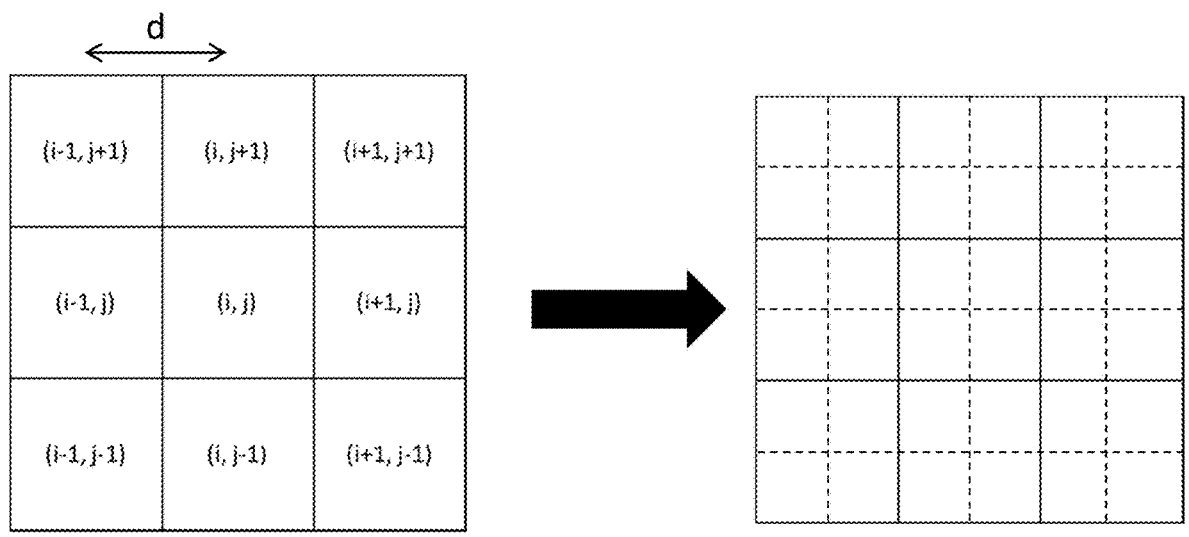
FIG. 3 illustrates an example embodiment of sub-pixelation correction.

Referring to FIG. 3, in an embodiment, each pixel may be divided into sub-pixels or sub-pixelated regions. In an embodiment, pixels may be labelled in a grid-like structure with rows and columns. For ease of explanation square pixels are illustrated, however, different geometric shapes and interlocking shapes may be used. For row and column nomenclature, columns may be defined as i, and rows may be defined as j. For example, a central pixel may be given be given a location identifier as "i, j" and a pixel to the left would be "i−1, j" and a pixel above "i, j+1". Alternatively, columns and rows may simply be given a number identifier. For example, columns and rows may be identified in numerical order from left to right and bottom to top, or the like.

For example, a central pixel may be the place of interaction indicating the 2D location of "rest" of the photon. The central pixel is the pixel that provided the highest energy signal with respect to the photon interaction. The neighboring pixels indicate pixels that provided an energy signal but that was not as great as the central pixel. For example, the central pixel also known as the triggering pixel may be defined as as "i, j" and a neighboring pixel to the left in a box or ring around the central pixel would be "i−1, j" and a neighboring pixel above "i, j+1".

Pixels may be further subdivided or sub-pixilated. For example, a single pixel may be divided into 2×2 sub-pixelated regions (See FIG. 3). For example, a regular 3×3 pixel area may be converted into a 'virtual' 6×6 sub-pixelated areas using a processing method. For this particular example, a single pixel would have four sub-pixels within the pixel boundary. In other words, a single pixel may be divided in a sub-pixelated region of 4 areas. Other divisions are contemplated and disclosed, the 2×2 sub-pixelation is an illustrative example. As another example, a factor of 3×3 sub-pixelated areas or more may be used. Sub-pixelization provides greater resolution at a lower electrical noise and/or production cost.

At 104, in an embodiment, the system and method may determine from the photoelectron cloud a characteristic of the photon interaction. A characteristic may include time, position, energy, or the like. In an embodiment, the method or system may receive a triggering signal as explained above. For example, the system may receive a trigger which may be at a central pixel, such as pixel (i,j). The system may then obtain negative energy or negative-charge induction of neighboring pixels, such as NE(i−1,j) and (i+1,j). The system may perform a calibration step. The calibration may be represented by NE'(i, j)=(NE(i, j)—baseLineNoise(i, j))*gain(i, j). Additionally, a correction factor may be used. The correction may be an under range cut. The correction may be represented by: (NE'(i+1,j)−NE'(i−1,j))/(NE'(i−1,j)+NE'(i+1,j)). In embodiment, the correction factor may be added to the triggering pixel (i,j).

Figure 4:
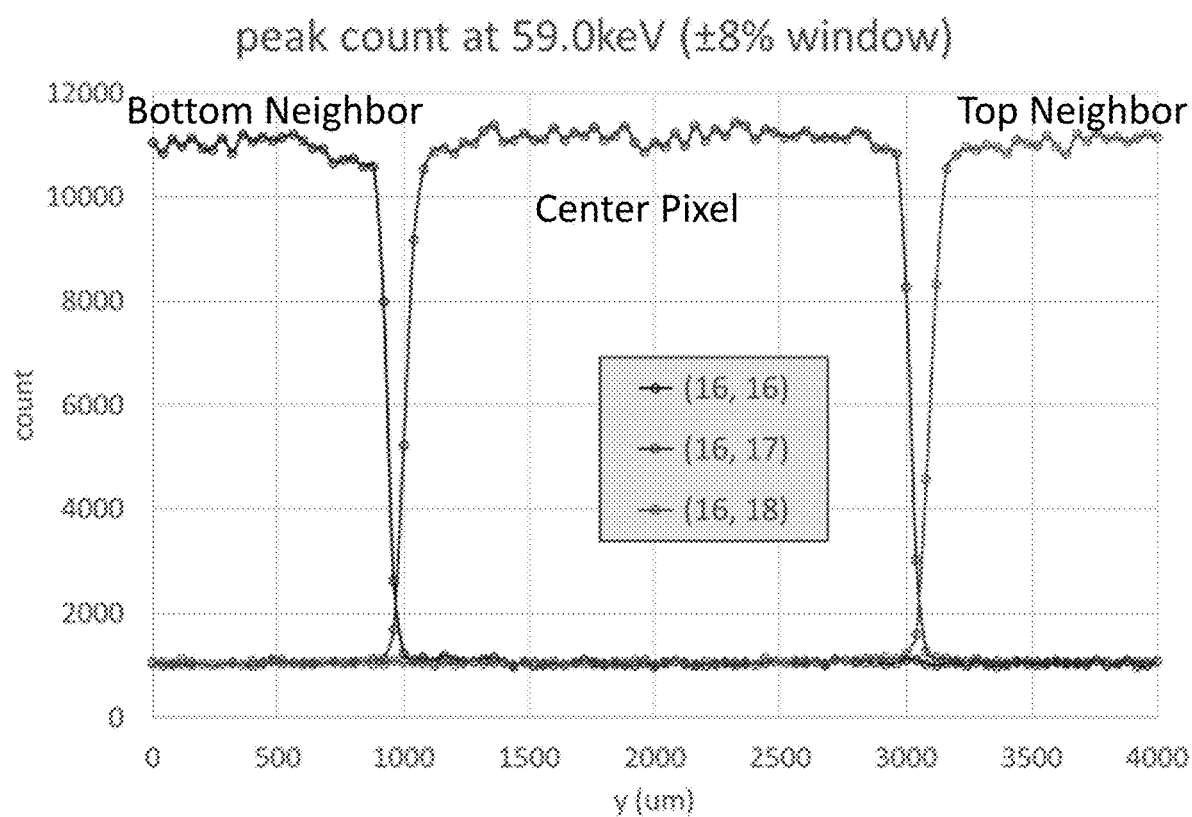
FIG. 4 illustrates an example count data from three consecutive pixels.
Figure 5:
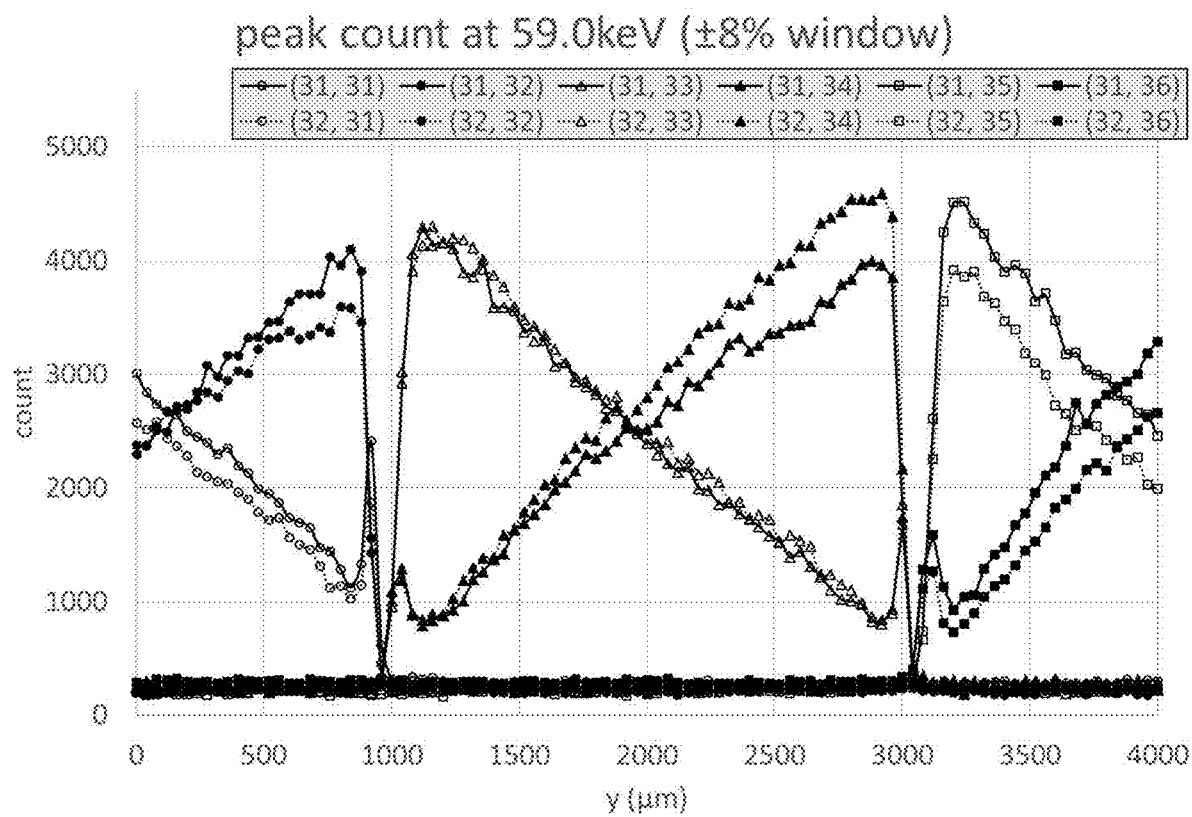
FIG. 5 illustrates example data of a factor of 2×2 sub-pixelation.

Referring to FIG. 4, an illustrative example of sample data from a central pixel and 2 neighbors are shown. For example, at a peak count at 59.0 keV a Bottom neighbor, center pixel, and top neighbor are illustrated. The example data demonstrates both photo peak data and a pixel gap. As an example, actual physical gap between pixels may be 75 μm. Example data shows an apparent gap of up to −200 μm, and may be due to the dominant effect of charge-sharing when a beam of photons are illuminating a between-the-gap area. In some cases, the majority of electron clouds are split into 2 (and thus registered in 2 or more pixels), each with apparent lower energies. Since y-axis is a peak count from a particular energy window, neither such signals are collected. A width of pixel gap may be determined using an X-ray tube source for high-flux clean anticipated spectra in conjunction with a mobile jig for movement of the pixel arrays in x, y, and z axes. As an example, the X-ray tube may be fixed and the detector system is moved in small increments, for example, 20-40 μm. Alternatively, the x-ray may be moved with a static detector system. This method may be used to apply a sub-pixelation technique to final data to see precision or fine tuning of the method. Referring to FIG. 5, in an embodiment the system and method may use a 2×2 sub-pixelation technique. FIG. 5 represents an example embodiment of a 2×2 pixelation statistically. For example, if a photon and resulting photon cloud occurs closer to one side of the central pixel, the system and method may identify the position to a sub-millimeter precision. The technique may also use a collimator in conjunction with a photon source to obtain this level of resolution and precision. In the example illustrated, the photon source is being moved across the array in a direction from row 33 to row 34. For each pixel using the 2×2 sub-pixelation technique, a count may be plotted over a distance. In this example, the peak count is at 59.0 keV. However, other peak counts may be used, for example, 67.2 keV.

Figure 6:
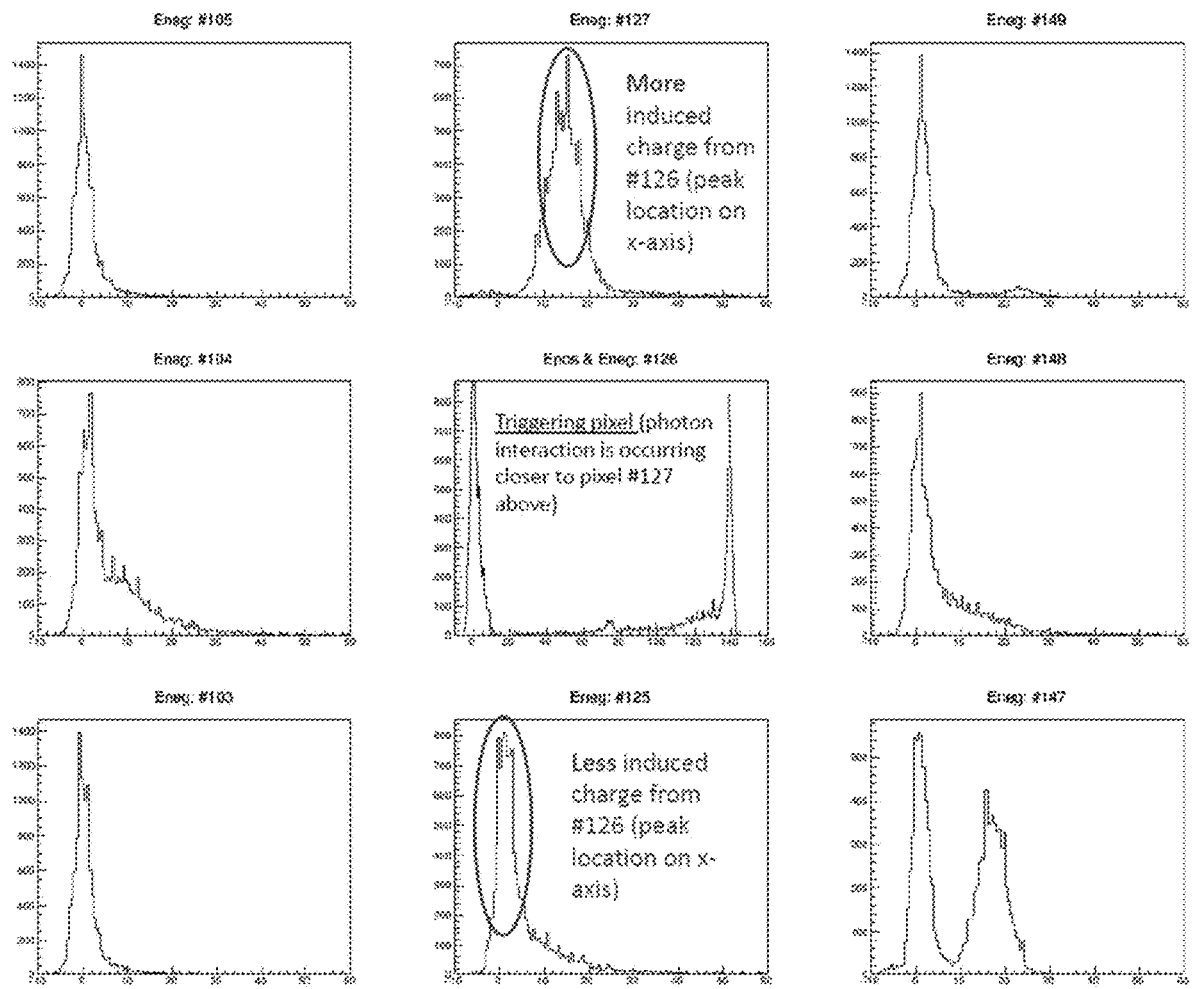
FIG. 6 illustrates example data of a center pixel and surrounding eight neighbors.

Referring to FIG. 6, an amount of induced charge may be plotted over a distance (measure in μm). In this example, a central pixel is located in the center of the figure, and the eight neighboring pixel data are shown. The triggering pixel (the central pixel) as is labelled #126. The central pixel receives the greatest signal from the photon cloud. Referring to pixel #127, there is more induced charge as compared to pixel #125, demonstrating the location of the photon interaction is closer to #127 than #125. Such a technique allows better spatial resolution of hardware on a pixel array.

In an embodiment, the system or method may identify whether a characteristic of the interaction may be determined. The system may determine many different characteristics with regard to the interaction, for example, the characteristic may include time, position (maybe including depth), energy, intensity, or the like. To determine a characteristic, the system may receive a signal from one or more pixels, for example, the central and neighboring pixels. For example, a photon may not enter a detector pixel array at a right angle of incidence. Thus, as the photon is traveling through the detector, the photon may interact with more than one pixel. In other words, as a photon enters the detector pixel plane, the interaction may "share" characteristics (i.e. energy) with one or more neighboring pixels. Different characteristics may be determined using the signals received from not only the central pixel, but also the neighboring pixels. The system may use these signals to directly identify a characteristic or may attribute these signals to signals from other pixels. The system may determine one or more characteristics simultaneously or at different times.

In an embodiment, the determined characteristic may include a depth of the interaction. In an embodiment, a depth of the interaction may be determined by first identifying a multidimensional space of two or more dimensions comprising peak signal amplitude responses along multiple axes: 1) positive polarity of the central pixel, 2) positive polarity of the neighboring pixels, and optionally, 3) negative polarity of the neighboring pixel. The next step is to identify one or more clusters within this multidimensional space which represent one or more mechanisms of interpixel charge sharing or hole trapping, which is depth dependent.

Each of these pixel and sub-pixelated signals may also have an associated amplitude representing, for example, an interaction energy of the signal. Therefore, the signals from a pixel may include signals having peak amplitudes of positive polarity signals and peak amplitudes of negative polarity signals. Using these signals from the central and neighboring pixels, the system can determine a time, location, energy, and depth of the interaction, for example, by clustering these signals in the multidimensional space. As stated above, the system and method described herein only capture peak amplitude signals from the anode portion of the detector. Thus, by analyzing and correlating the amplitude peaks of both positive and negative polarity signals from all of the pixels (e.g., central pixel and neighboring pixels), the system can determine at what depth the interaction occurred. Thus, the system can determine a position characteristic, including the depth of the interaction.

The system may also determine other characteristics using the signals from one or more neighboring pixels in addition to the signal from the central pixel. For example, using the signals from one or more neighboring pixels, in addition to the central pixel, may allow a better resolution with respect to characteristics such as time, position, energy, or the like. Determination of some of these characteristics may be completed using conventional techniques except that the signals from the neighboring pixels are taken into account with the signals of the central pixel, which provides a more precise or accurate determination of the characteristic.

For example, the system may determine a position of the interaction with respect to a two-dimensional position that is more precise than conventional systems and methods. For example, the interaction of a photon with neighboring pixels may adjust the location of a photon to a sub-pixel resolution, rather than merely a pixel resolution. As an example, referring to FIG. 2, the interaction occurs on the left side of the central pixel with respect to an imaginary center line of the pixel. Using the information from the neighboring pixels, the system may identify that this interaction occurred on left side of the central pixel, instead of merely identifying that the interaction occurred at the central pixel. For example, by identifying the signals from the neighboring pixels, the system can determine which neighboring pixels had higher signals as compared to other neighboring pixels. Due to the fact that pixels closer to the interaction will have a higher signal, if the interaction occurs off-center, the neighboring pixels closer to the interaction will provide a higher signal than pixels further from the interaction. Thus, by identifying which pixels have a higher signal, the system can determine at which side of the pixel the interaction occurred.

For example, the system may use a weighted average to identify sub-pixel position information. As an illustrative example, if the detector pixel array receives an interaction of a photon where one neighboring pixel receives ⅔ of the interaction that occurs outside of the central pixel and another neighboring pixel receives ⅓ of the interaction that occurs outside of the central pixel, then the system may determine where the event occurred along the line of the centers of the two pixels by weighting these two interactions along the central pixel. In other words, the interaction may not fall on the center of the area of a pixel and the neighboring pixels allow for a more precise location of the interacting photon to be determined.

As another example of a more accurate or precise characteristic determination, the system can determine a more precise energy of the interaction. When the photon interacts with a pixel, neighboring pixels may receive a portion of the interaction. This is referred to as shared charge. Thus, the system may attribute the charge received by a neighboring pixel to the central pixel to provide a more accurate representation of the actual energy of the interaction. To provide this more accurate representation the system may correct the energy value received from the central pixel. The correction may include adding the shared charge of one or more neighboring pixels to the response of the central pixel. In other words, if an interaction of a photon is detected by a pixel array, then the charge detected by neighboring pixels may be added to the value of the charge of the center pixel. As an example, if a photon interacts with a detector pixel array in which 80% of the charge is received at the central pixel and 20% of the charge is received at neighboring pixels, then the 20% charge of the neighboring pixels may be assigned to the center pixel.

If one or more characteristics cannot be determined for an interaction at 104, the system may ignore the interaction and receive information related to a new interaction at 101. If, on the other hand, the system can determine one or more characteristics at 104, the system may record data related to the interaction at 105. This recorded data may be analyzed in real-time or saved for later analysis. Additionally, the recorded data may be used by the systems as described herein to generate one or more images of the object that is being scanned using the imaging device.

The various embodiments described herein thus represent a technical improvement to imaging devices that may require high sensitivity and resolution to the material imaged. An embodiment allows for the use of sub-pixelation to determine characteristics of an interaction by a photon. Using the techniques described herein, rather than requiring longer imaging sessions and/or higher radiological doses, a more complete image may be achieved with lower imaging session durations and/or lower radiological doses. Such a system results in more accurate imaging, less device downtime, and lower costs associated with the imaging procedure.

Figure 7:
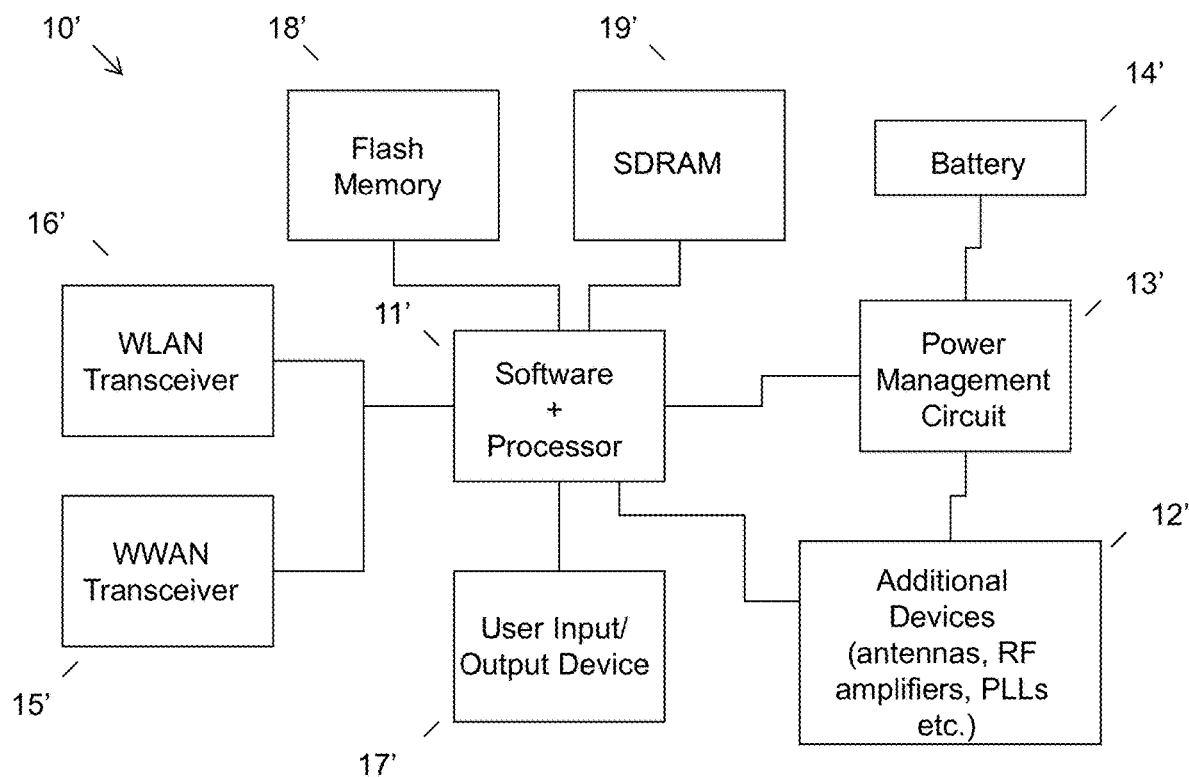
FIG. 7 illustrates an example of information handling device circuitry.

While various other circuits, circuitry or components may be utilized in information handling devices, with regard to an instrument for determining a characteristic of an electron cloud upon a subset of pixels according to any one of the various embodiments described herein, an example is illustrated in FIG. 7. Device circuitry 10' may include a measurement system on a chip design found, for example, a particular computing platform (e.g., mobile computing, desktop computing, etc.) Software and processor(s) are combined in a single chip 11'. Processors comprise internal arithmetic units, registers, cache memory, busses, I/O ports, etc., as is well known in the art. Internal busses and the like depend on different vendors, but essentially all the peripheral devices (12') may attach to a single chip 11'. The circuitry 10' combines the processor, memory control, and I/O controller hub all into a single chip 11'. Also, systems 10' of this type do not typically use SATA or PCI or LPC. Common interfaces, for example, include SDIO and I2C.

There are power management chip(s) 13', e.g., a battery management unit, BMU, which manage power as supplied, for example, via a rechargeable battery 14', which may be recharged by a connection to a power source (not shown). In at least one design, a single chip, such as 11', is used to supply BIOS like functionality and DRAM memory.

System 10' typically includes one or more of a WWAN transceiver 15' and a WLAN transceiver 16' for connecting to various networks, such as telecommunications networks and wireless Internet devices, e.g., access points. Additionally, devices 12' are commonly included, e.g., a transmit and receive antenna, oscillators, PLLs, etc. System 10' includes input/output devices 17' for data input and display/rendering (e.g., a computing location located away from the single beam system that is easily accessible by a user). System 10' also typically includes various memory devices, for example flash memory 18' and SDRAM 19'.

It can be appreciated from the foregoing that electronic components of one or more systems or devices may include, but are not limited to, at least one processing unit, a memory, and a communication bus or communication means that couples various components including the memory to the processing unit(s). A system or device may include or have access to a variety of device readable media. System memory may include device readable storage media in the form of volatile and/or nonvolatile memory such as read only memory (ROM) and/or random access memory (RAM). By way of example, and not limitation, system memory may also include an operating system, application programs, other program modules, and program data. The disclosed system may be used in an embodiment of an instrument for determining a characteristic of an electron cloud upon a subset of pixels.

As will be appreciated by one skilled in the art, various aspects may be embodied as a system, method or device program product. Accordingly, aspects may take the form of an entirely hardware embodiment or an embodiment including software that may all generally be referred to herein as a "circuit," "module" or "system." Furthermore, aspects may take the form of a device program product embodied in one or more device readable medium(s) having device readable program code embodied therewith.

As will be appreciated by one skilled in the art, various aspects may be embodied as a system, method or device program product. Accordingly, aspects may take the form of an entirely hardware embodiment or an embodiment including software that may all generally be referred to herein as a "circuit," "module" or "system." Furthermore, aspects may take the form of a device program product embodied in one or more device readable medium(s) having device readable program code embodied therewith.

It should be noted that the various functions described herein may be implemented using instructions stored on a device readable storage medium such as a non-signal storage device, where the instructions are executed by a processor. In the context of this document, a storage device is not a signal and "non-transitory" includes all media except signal media.

Program code for carrying out operations may be written in any combination of one or more programming languages. The program code may execute entirely on a single device, partly on a single device, as a stand-alone software package, partly on single device and partly on another device, or entirely on the other device. In some cases, the devices may be connected through any type of connection or network, including a local area network (LAN) or a wide area network (WAN), or the connection may be made through other devices (for example, through the Internet using an Internet Service Provider), through wireless connections, e.g., near-field communication, or through a hard wire connection, such as over a USB connection.

It should be noted that the various functions described herein may be implemented using instructions stored on a device readable storage medium such as a non-signal storage device that are executed by a processor. A storage device may be, for example, an electronic, magnetic, optical, electromagnetic, infrared, or semiconductor system, apparatus, or device, or any suitable combination of the foregoing. More specific examples of a storage medium would include the following: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a storage device is not a signal and "non-transitory" includes all media except signal media.

Program code embodied on a storage medium may be transmitted using any appropriate medium, including but not limited to wireless, wireline, optical fiber cable, RF, et cetera, or any suitable combination of the foregoing.

Program code for carrying out operations may be written in any combination of one or more programming languages. The program code may execute entirely on a single device, partly on a single device, as a stand-alone software package, partly on single device and partly on another device, or entirely on the other device. In some cases, the devices may be connected through any type of connection or network, including a local area network (LAN) or a wide area network (WAN), or the connection may be made through other devices (for example, through the Internet using an Internet Service Provider), through wireless connections, e.g., near-field communication, or through a hard wire connection, such as over a USB connection.

Example embodiments are described herein with reference to the figures, which illustrate example methods, devices and program products according to various example embodiments. It will be understood that the actions and functionality may be implemented at least in part by program instructions. These program instructions may be provided to a processor of a device, a special purpose information handling device, or other programmable data processing device to produce a machine, such that the instructions, which execute via a processor of the device implement the functions/acts specified.

It is noted that the values provided herein are to be construed to include equivalent values as indicated by use of the term "about." The equivalent values will be evident to those having ordinary skill in the art, but at the least include values obtained by ordinary rounding of the last significant digit.

It is worth noting that while specific blocks are used in the figures, and a particular ordering of blocks has been illustrated, these are non-limiting examples. In certain contexts, two or more blocks may be combined, a block may be split into two or more blocks, or certain blocks may be re-ordered or re-organized as appropriate, as the explicit illustrated examples are used only for descriptive purposes and are not to be construed as limiting.

As used herein, the singular "a" and "an" may be construed as including the plural "one or more" unless clearly indicated otherwise.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

What is claimed is:

1. A method, comprising:
   receiving a photon interaction occurring within a photon detector pixel array, wherein the photon detector pixel array comprises a plurality of pixels;
   determining a photoelectron cloud generated from the photon interaction, wherein the photon detector pixel array comprises an electric field, wherein an electrostatic repulsive force disperses a photon to the photoelectron cloud;
   identifying a subset of the plurality of pixels associated with the photon interaction, wherein each of the subset of the plurality of pixels corresponds to pixels activated by the photo electron cloud, wherein the subset of the plurality of pixels comprise a central pixel and a plurality of neighboring pixels, wherein the central pixel comprises the pixel having the highest amplitude response to the photon interaction; and
   determining, from the photoelectron cloud, a characteristic of the photon interaction, wherein the characteristic comprises at least one of: time, position, and energy of the interaction, wherein the determining comprises adding a correction factor from each of the plurality of pixels to the central pixel based upon a ratio of energy of each of the plurality of pixels.

2. The method of claim 1, wherein the photon detector array comprises an anode and a cathode that generates electro-static repulsion within the photon.

3. The method of claim 1, wherein the central pixel receives a negative charge current induction.

4. The method of claim 1, wherein each of the plurality of neighboring pixels receives a positive charge current induction.

5. The method of claim 4, wherein the positive charge current induction is proportional to a subset of the photoelectron cloud.

6. The method of claim 1, wherein the characteristic comprises a location of the photon interaction, wherein the determining the location of the interaction comprises comparing a pulse height from at least two neighboring pixels.

7. The method of claim 1, wherein the characteristic comprises an intensity of the photon interaction, wherein the intensity is based upon adding a response to the central pixel and the plurality of neighboring pixels.

8. The method of claim 1, wherein the characteristic comprises a location of the photon interaction, wherein the determining the location of the interaction comprises comparing a latency from at least two neighboring pixels.

9. The method of claim 1, wherein the plurality of responses does not correspond to responses from a cathode of the photon detector pixel array.

10. The method of claim 1, wherein the photon detector pixel array comprises an array of pixelated semiconductor detectors comprising CdZnTe.

11. An apparatus, comprising:
    a photon detector pixel array comprising a plurality of pixels;
    a processor operatively coupled to the photon detector pixel array;
    a memory device that stores instructions executable by the processor to:
    receive a photon interaction occurring within a photon detector pixel array, wherein the photon detector pixel array comprises a plurality of pixels;
    determine a photoelectron cloud generated from the photon interaction, wherein the photon detector pixel array comprises an electric field, wherein an electrostatic repulsive force disperses a photon to the photoelectron cloud;
    identify a subset of the plurality of pixels associated with the photon interaction, wherein each of the subset of the plurality of pixels corresponds to pixels activated by the photo electron cloud, wherein the subset of the plurality of pixels comprise a central pixel and a plurality of neighboring pixels, wherein the central pixel comprises the pixel having the highest amplitude response to the photon interaction; and
    determine, from the photoelectron cloud, a characteristic of the photon interaction, wherein the characteristic comprises at least one of: time, position, and energy of the interaction, wherein the determining comprises adding a correction factor from each of the plurality of pixels to the central pixel based upon a ratio of energy of each of the plurality of pixels.

12. The device of claim 11, wherein the photon detector array comprises an anode and a cathode that generates electro-static repulsion within the photon.

13. The device of claim 11, wherein the central pixel receives a negative charge current induction.

14. The device of claim 11, wherein each of the plurality of neighboring pixels receives a positive charge current induction.

15. The device of claim 14, wherein the positive charge current induction is proportional to a subset of the photoelectron cloud.

16. The device of claim 11, wherein the characteristic comprises a location of the photon interaction, wherein the determining the location of the interaction comprises comparing a pulse height from at least two neighboring pixels.

17. The device of claim 11, wherein the characteristic comprises an intensity of the photon interaction, wherein the intensity is based upon adding a response to the central pixel and the plurality of neighboring pixels.

18. The device of claim 11, wherein the characteristic comprises a location of the photon interaction, wherein the determining the location of the interaction comprises comparing a latency from at least two neighboring pixels.

19. The device of claim 11, wherein the plurality of responses does not correspond to responses from a cathode of the photon detector pixel array.

20. A product, comprising:
a non-transitory storage device that stores code, the code being executable by a processor and comprising:
code that receives a photon interaction occurring within a photon detector pixel array, wherein the photon detector pixel array comprises a plurality of pixels;
code that determines a photoelectron cloud generated from the photon interaction, wherein the photon detector pixel array comprises an electric field, wherein an electrostatic repulsive force disperses a photon to the photoelectron cloud;
code that identifies a subset of the plurality of pixels associated with the photon interaction, wherein each of the subset of the plurality of pixels corresponds to pixels activated by the photo electron cloud, wherein the subset of the plurality of pixels comprise a central pixel and a plurality of neighboring pixels, wherein the central pixel comprises the pixel having the highest amplitude response to the photon interaction; and
code that determines, from the photoelectron cloud, a characteristic of the photon interaction, wherein the characteristic comprises at least one of: time, position, and energy of the interaction, wherein the determining comprises adding a correction factor from each of the plurality of pixels to the central pixel based upon a ratio of energy of each of the plurality of pixels.

* * * * *